(12) United States Patent
Wojnowski et al.

(10) Patent No.: US 10,186,481 B2
(45) Date of Patent: Jan. 22, 2019

(54) SEMICONDUCTOR DEVICE INCLUDING A PASSIVE COMPONENT FORMED IN A REDISTRIBUTION LAYER

(71) Applicant: Infineon Technologies AG, Neubiberg (DE)

(72) Inventors: Maciej Wojnowski, Munich (DE); Frank Daeche, Unterhaching (DE); Zeeshan Umar, Munich (DE)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 15/459,270

(22) Filed: Mar. 15, 2017

(65) Prior Publication Data
US 2017/0271260 A1  Sep. 21, 2017

(30) Foreign Application Priority Data

Mar. 18, 2016  (DE) .................. 10 2016 105 096

(51) Int. Cl.
H01L 29/00 (2006.01)
H01L 23/522 (2006.01)
H01L 23/552 (2006.01)
H01F 17/00 (2006.01)
H01L 23/498 (2006.01)
H01L 23/538 (2006.01)
H02M 3/158 (2006.01)

(52) U.S. Cl.
CPC ......... H01L 23/5227 (2013.01); H01F 17/00 (2013.01); H01L 23/49822 (2013.01); H01L 23/5226 (2013.01); H01L 23/5389 (2013.01); H01L 23/552 (2013.01); H01L 2224/16225 (2013.01); H01L 2224/18 (2013.01); H01L 2924/181 (2013.01); H02M 3/158 (2013.01)

(58) Field of Classification Search
None
See application file for complete search history.

(56) References Cited

U.S. PATENT DOCUMENTS

| | | |
|---|---|---|
| 8,198,714 B2 * | 6/2012 | Rofougaran ........ H01F 17/0013 257/678 |
| 8,552,828 B1 | 10/2013 | Beer et al. |
| 8,716,859 B2 | 5/2014 | Meyer et al. |
| 9,190,389 B2 | 11/2015 | Meyer-Berg et al. |
| 9,263,425 B2 | 2/2016 | Scharf et al. |
| 9,318,432 B2 | 4/2016 | Lenive et al. |
| 2004/0238929 A1 | 12/2004 | Anzai et al. |
| 2010/0052839 A1 | 3/2010 | Mertens et al. |
| 2010/0230806 A1 * | 9/2010 | Huang ................ H01L 23/50 257/723 |
| 2012/0261796 A1 | 10/2012 | Meyer-Berg |
| 2014/0076617 A1 | 3/2014 | Chen et al. |
| 2014/0084391 A1 | 3/2014 | Lenive et al. |
| 2014/0246753 A1 | 9/2014 | Song et al. |
| 2014/0312458 A1 | 10/2014 | Ashrafzadeh et al. |
| 2015/0076700 A1 | 3/2015 | Yap |
| 2015/0179570 A1 | 6/2015 | Marimuthu et al. |
| 2015/0206837 A1 | 7/2015 | Gu et al. |

* cited by examiner

Primary Examiner — Hung Vu
(74) Attorney, Agent, or Firm — Dicke, Billig & Czaja, PLLC

(57) ABSTRACT

A device includes a semiconductor chip, a plurality of planar metallization layers arranged over a main surface of the semiconductor chip, and a passive component including windings, wherein each of the windings is formed in one of the plurality of planar metallization layers.

21 Claims, 7 Drawing Sheets

SEMICONDUCTOR DEVICE INCLUDING A PASSIVE COMPONENT FORMED IN A REDISTRIBUTION LAYER

CROSS-REFERENCE TO RELATED APPLICATION

This Utility Patent Application claims priority to German Patent Application No. 10 2016 105 096.2, filed Mar. 18, 2016; which is incorporated herein by reference.

TECHNICAL FIELD

The disclosure relates, in general, to semiconductor devices. More particular, the disclosure relates to semiconductor devices including a passive component formed in a redistribution layer.

BACKGROUND

Semiconductor devices may include multiple electronic components of arbitrary types. The arrangement and assembly of the electronic components may affect the performance and the dimensions of the devices. Semiconductor devices constantly have to be improved. In particular, it may be desirable to improve the performance of the devices and reduce their dimensions at the same time.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts.

DETAILED DESCRIPTION

Figure 1:
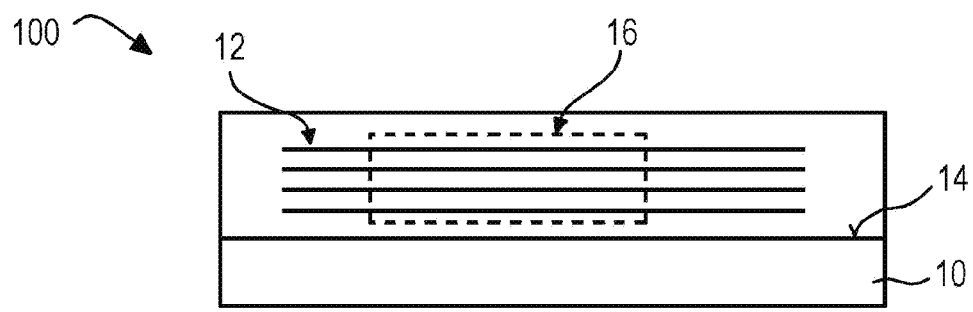
FIG. 1 schematically illustrates a cross-sectional side view of a device in accordance with the disclosure.

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense, and the concept of the present disclosure is defined by the appended claims.

As employed in this specification, the terms "connected", "coupled", "electrically connected" and/or "electrically coupled" may not necessarily mean that elements must be directly connected or coupled together. Intervening elements may be provided between the "connected", "coupled", "electrically connected" or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or more additional layers being arranged between the implied surface and the material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. An actual angle between involved components may deviate from an exact value of 90 (or 0) degrees by a deviation value that may particularly depend on tolerances that may typically occur when applying techniques for fabricating the components.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures. In addition, the features of the various exemplary aspects described herein may be combined with each other, unless specifically noted otherwise.

The devices described herein may include one or more semiconductor chips that may be of different types and may be manufactured by different technologies. In general, the semiconductor chips may include integrated circuits, passive electronic components, active electronic components, etc. The integrated circuits may be designed as logic integrated circuits, analog integrated circuits, mixed signal integrated circuits, power integrated circuits, etc. The semiconductor chips need not be manufactured from a specific semiconductor material and may contain inorganic and/or organic materials that are not semiconductors, such as, for example, insulators, plastics, metals, etc. In one example, the semiconductor chips may be manufactured from an elemental semiconductor material, for example Si, etc. In a further example, the semiconductor chips may be manufactured from a compound semiconductor material, for example GaN, SiC, SiGe, GaAs, etc. The term "main surface" of a semiconductor chip may be used herein and may particularly relate to a surface of the semiconductor chip including electric contacts (or electrodes) of the semiconductor chip. The electrodes may provide electric access to the internal circuitry of the semiconductor chip.

In one example, the semiconductor chips may include a power semiconductor. In general, power semiconductor chips may be configured as diodes, power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), super junction devices, power bipolar transistors, etc. In a first example, the power semiconductor chips may have a vertical structure, i.e. the semiconductor chips may be fabricated such that electrical currents may substantially flow in a direction perpendicular to the main surfaces of the semiconductor chips. For example, the gate electrode and the source electrode of a power MOSFET may be arranged over one main surface while the drain electrode of the power MOSFET may be arranged over the other main surface. In a second example, the power semiconductor chips may have a lateral structure, i.e. the semiconductor chips may be fabricated such that electrical currents may substantially flow in a direction parallel to a main surface of the semiconductor chips. For example, the gate electrode, the source electrode and the drain electrode of a power MOSFET may be arranged over one main surface of the power MOSFET.

In a further example, the semiconductor chips may be configured to control (or drive) electronic components of a device in accordance with the disclosure. For example, such control (or drive) semiconductor chips may be configured to control the integrated circuits of one or more power semiconductor chips. A control circuit may be configured to drive one or more electronic components of the device, such as e.g. a high-power transistor. The driven components may be voltage driven or current driven. In one example, driving a component including a gate electrode may be performed by a gate driver circuit. The driving process may include applying different voltages to the gate electrode, for example in form of turn-on and turn-off switching wave forms.

The devices described herein may include a plurality of planar metallization layers that may be particularly arranged over a main surface of a semiconductor chip. The metallization layers may laterally extend over the main surface of the semiconductor chip or over other layers arranged between the semiconductor chip and the metallization layers, such as e.g. dielectric layers. One or more of the metallization layers may be partially located outside and/or inside an outline (or a footprint) of the semiconductor chip.

The metallization layers may be employed as wiring layers to make electrical contact with a semiconductor chip from outside the device and/or to make electrical contact with other semiconductor chips and/or components included in the device. In particular, the metallization layers may electrically couple contact elements of the semiconductor chips to external contact elements of the device. In other words, the metallization layers may be configured to make I/O pads of the semiconductor chips available in other locations. The metallization layers may therefore also be referred to as redistribution layer. In particular, the metallization layers may be arranged substantially parallel to a main surface of the semiconductor chip and may thus provide redistribution in this parallel direction.

The metallization layers may be manufactured with any desired geometric shape and/or any desired material composition. For example, the metallization layers may be structured and may have a shape of conductor lines (or conductor tracks), but may also be in the form of a layer covering an area. Any suitable metal, for example at least one of aluminum, nickel, palladium, titanium, titanium tungsten, silver, tin, gold, molybdenum, vanadium or copper, or associated metal alloys may be used for manufacturing the metallization layers.

The devices described herein may include a plurality of planar dielectric layers that may be particularly arranged between the plurality of metallization layers. The dielectric layers may be configured to electrically insulate the metallization layers from each another. In addition, the devices described herein may include a plurality of vias (or through hole connections) that may be configured to electrically couple metallization layers arranged on different levels, thus providing an electrical interconnection between different metallization layers. The vias may particularly extend in a direction substantially perpendicular to the metallization layers.

The devices described herein may include passive electronic components. In general, passive electronic components may include any kind of resistors, capacitors, inductive components, antennas, etc. In particular, passive components like inductors or transformers or coils may include one or multiple windings. In one example, windings of a passive component may be formed by one of the planar metallization layers described above. An interconnection between windings formed in different metallization layers may then be established by one or more vias. In a further example, a winding of a passive component may be composed of metallization layers on different levels and vias. More detailed examples of passive components including windings are provided below.

The devices described herein may include a magnetic material that may be surrounded by windings of a passive component. In this regard, the magnetic material may act as a magnetic core in order to increase an inductance of the passive component. The material composition of the magnetic material may vary. In one example, the magnetic core may include at least one of a ferromagnetic metal (e.g. iron) or a ferrimagnetic material (e.g. ferrite). In a further example, the magnetic core may include a soft ferromagnetic material. In a more particular example, the magnetic core may include at least one of an amorphous cobalt alloy and a cobalt fluoropolymer. The shape of the magnetic material may vary. In one example, the magnetic material may be placed in an opening extending through a plurality of planar metallization layers including windings of a passive component. In a further example, the magnetic material may be composed of a plurality of magnetic sheets, wherein each of the magnetic sheets may be arranged in one of the plurality of planar metallization layers and surrounded by windings of a passive component. In yet a further example, windings of a passive component may be embedded (or encapsulated) in the magnetic material.

The devices described herein may include a metal structure that may be arranged between a semiconductor chip and a passive component formed in a redistribution layer. The metal structure may be configured to reduce electromagnetic couplings between the semiconductor chip and the passive component. That is, the metal structure may provide the functionality of an electromagnetic shielding. In particular, the metal structure may be at least partly formed by one or multiple of the planar metallization layers described above. The metal structure may be grounded in order to improve the electromagnetic decoupling between the semiconductor chip and the passive component. In one example, the metal structure may be formed as a plain metal area. In a further example, a shape of the metal structure may be configured to reduce an induction of electric currents in the metal structure during an operation of the device. Electric currents in the metal structure may be induced by electric currents running through windings of a passive component. In this regard, the metal structure may include a plurality of openings having a shape configured to reduce an induction of (in particular circular) electric currents in the metal structure during an operation of the device.

Figure 2:
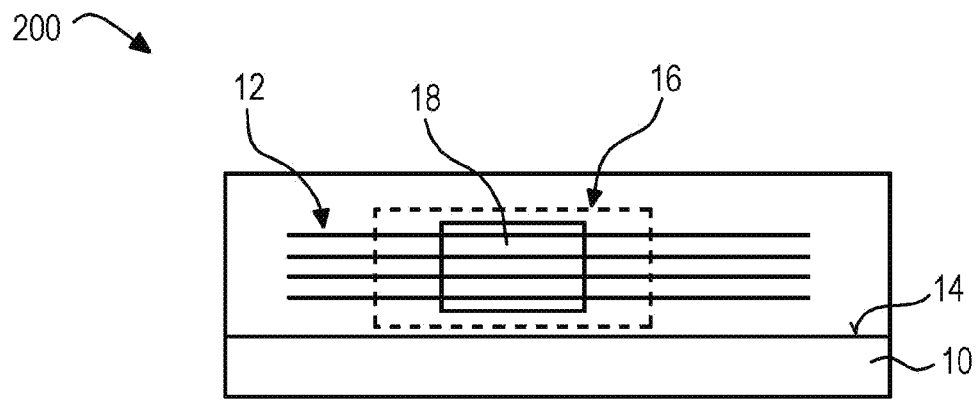
FIG. 2 schematically illustrates a cross-sectional side view of a device in accordance with the disclosure.
Figure 3:
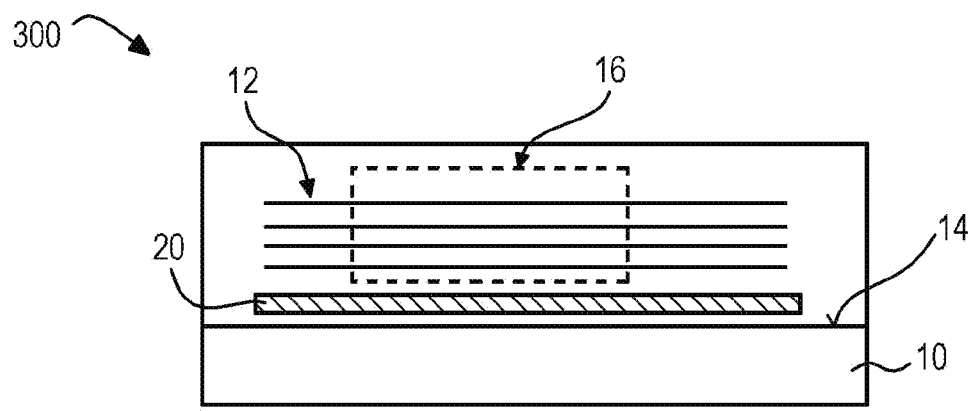
FIG. 3 schematically illustrates a cross-sectional side view of a device in accordance with the disclosure.

FIGS. 1 to 3 schematically illustrate cross-sectional side views of devices 100 to 300 in accordance with the disclosure. Each of the devices 100 to 300 is illustrated in a general manner in order to qualitatively specify an aspect of the disclosure. The devices 100 to 300 may include further components which are not illustrated for the sake of simplicity. For example, the devices 100 to 300 may further include one or more components of other devices in accordance with the disclosure.

The device 100 may include a semiconductor chip 10 and a plurality of planar metallization layers 12 arranged over a main surface 14 of the semiconductor chip 10. The metallization layers 12 may be configured as wiring layers to make electrical contact with the semiconductor chip 10 from outside the device 100 and/or to make electrical contact with other semiconductor chips and/or components that may be included in the device 100. That is, the metallization layers 12 may provide the functionality of a redistribution layer. In the example of FIG. 1, the metallization layers 12 are illustrated to not extend over the outline (or footprint) of the semiconductor chip 10. However, in further examples, the metallization layers 12 may extend over the outline of the semiconductor chip 10 in one or multiple directions with arbitrary distances. A detailed shape and structure of the planar metallization layers 12 is not illustrated for the sake of simplicity. More detailed examples of the metallization layers 12 are provided below. The device 100 may further include a passive component 16 including windings, wherein each of the windings is formed in one of the plurality of planar metallization layers 12. In the example of FIG. 1, the passive component 16 is shown to be located in a region indicated by a dashed rectangle. A detailed structure of the passive component 16 is not illustrated for the sake of simplicity. More detailed examples of the passive component 16 are provided below.

During an operation of the device 100, parasitic losses may occur that may inter alia depend on the length and cross section of a connection line between an output electrode of the semiconductor chip 10 and terminals of the passive component 16. Due to an arrangement of the passive component 16 in the redistribution layer formed by the plurality of metallization layers 12, the length and cross section of such connection line may be reduced compared to other devices with similar technical functionality. Furthermore, such other devices may provide passive components in form of separate discrete components that may be arranged side-by-side to a package including the semiconductor chip 10. Such discrete passive components may be the critical components with regard to the system height. For example, the height of a discrete passive component may be greater than 5 mm. Due to an arrangement of the passive component 16 in the redistribution layer as in the device 100, the height of the passive component may be reduced to values of smaller than 0.5 mm, resulting in a reduced system height. In addition, an arrangement of the passive component 16 inside an outline of the semiconductor chip 10, when viewed in a direction perpendicular to the main surface 14, may result in a reduced area consumption compared to other devices including discrete passive components. For example, an area consumption of a conventional power stage including two power MOSFETs, a control chip and an inductor may be up to 100 mm$^2$, while a solution in accordance with the disclosure and similar to FIG. 1 may provide a reduced area consumption of about 30 mm$^2$.

The device 200 of FIG. 2 may be at least partly similar to the device 100. The device 200 may include a semiconductor chip 10 and a plurality of planar metallization layers 12 arranged over a main surface 14 of the semiconductor chip 10. The device 200 may further include a passive component 16 including windings, wherein the windings are at least partly formed by the plurality of planar metallization layers 12. The device 200 may further include a magnetic material 18 arranged over the semiconductor chip 10 and surrounded by the windings. More detailed examples of the passive component 16 and the magnetic material 18 are provided below.

Due to a similar arrangement, the device 200 may provide similar technical features as the device 100 described above. In addition, the magnetic material 18 surrounded by the windings of the passive component 16 may increase an inductance of the passive components 16.

The device 300 of FIG. 3 may be at least partly similar to the devices 100 and 200. The device 300 may include a semiconductor chip 10 and a plurality of planar metallization layers 12 arranged over a main surface 14 of the semiconductor chip 10. The device 300 may further include a passive component 16 including windings, wherein the windings are at least partly formed by the plurality of planar metallization layers 12. The device 300 may further include a metal structure 20 arranged between the semiconductor chip 10 and the passive component 16. The metal structure 20 may be configured to reduce electromagnetic couplings between the semiconductor chip 10 and the passive component 16. In particular, the metal structure 20 may be at least partly formed by the plurality of planar metallization layers 12. More detailed examples of the metal structure 20 are provided below.

Due to a similar arrangement, the device 300 may provide similar technical features as the device 100 described above. In addition, the metal structure 20 may provide an electromagnetic shielding between the semiconductor chip 10 and the passive component 16 formed by the metallization layers 12. By integrating embedded passive components, such as e.g. inductors or transformers, closer to the semiconductor chip 10 compared to solutions with discrete passive components (see above), the semiconductor chip 10 may be exposed to stronger electromagnetic fields. The electromagnetic shielding provided by the metal structure 20 may have an effect of reducing the electromagnetic interactions between the semiconductor chip 10 and the embedded passive components.

Figure 4:
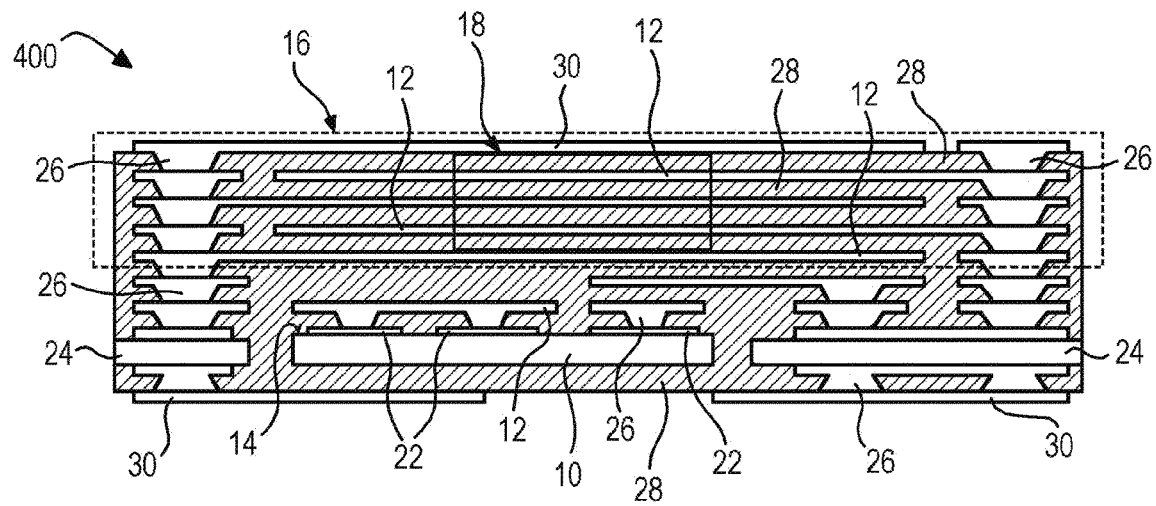
FIG. 4 schematically illustrates a cross-sectional side view of a device in accordance with the disclosure.

FIG. 4 schematically illustrates a cross-sectional side view of a device 400 in accordance with the disclosure. The device 400 may be seen as a more detailed implementation of the devices 100 to 300 such that details of the device 400 described below may be likewise applied to the devices 100 to 300.

The device 400 may include a semiconductor chip 10 with electrical contacts (or electrodes) 22, a dielectric core material 24, a plurality of planar metallization layers 12, a plurality of vias 26 and a plurality of dielectric layers 28. The device 400 may further include a passive component 16 (see dashed rectangle) including windings that may be formed in and by the planar metallization layer 12, external contact electrodes 30 arranged at a periphery of the device 400 and a region in which a magnetic material 18 may be arranged. The magnetic material 18 may be surrounded by the windings of the passive component 16.

The semiconductor chip 10 may be arranged between parts of the dielectric core material 24. For example, the semiconductor chip 10 may have been arranged in a cavity provided in the dielectric core material 24 during a fabrication of the device 400. In the example of FIG. 4, the upper and lower main surfaces of the semiconductor chip 10 may be substantially coplanar with the upper and lower surfaces of the dielectric core material 24.

The electrodes 22 of the semiconductor chip 10 may be electrically coupled to the metallization layers 12 and the vias 26 such that input and output of the semiconductor chip 10 may be made available (or may be redistributed) in other locations of the device 400. One or more of the electrodes 22 may be electrically coupled to the passive component 16. In this connection, it is to be noted that not all electrical interconnections of the device 400 may be visible in FIG. 4 due to the chosen perspective. For example, even when the cross-sectional side view of FIG. 4 does not explicitly illustrate an electrical interconnection between the semiconductor chip 10 and the passive component 16, such electrical interconnection may be provided by sections of the metallization layers 12 that are not shown in FIG. 4 because of the cross-sectional side perspective.

The metallization layers 12 and the vias 26 may be arranged such that the electrodes 22 of the semiconductor chip 10 may be electrically coupled to the external contact electrodes 30 arranged at the periphery of the device 400. The passive component 16 may be interconnected between the semiconductor chip 10 and an external electrode 30. In the example of FIG. 4, the semiconductor chip 10 is illustrated to include three electrodes 22 on its upper main surface 14. However, in further examples, the semiconductor chip 10 may include electrodes on its lower main surface or electrodes on both of its main surfaces. Depending on the location of the electrodes 22 and the required redistribution, the metallization layers 12 and vias 26 may be arranged over the upper and/or the lower main surface of the semiconductor chip 10. For example, the semiconductor chip 10 may be a power transistor including a gate electrode, a source electrode and a drain electrode which are arranged over the upper main surface 14. Due to the redistribution of the metallization layers 12, the three electrodes of the power transistor may be electrically coupled to the external electrodes 30 on the periphery of the device 400.

The device 400 may be configured to be mounted on a PCB (not illustrated), wherein the lower external electrodes 30 may face the PCB and provide an electrical coupling thereto. In addition, additional components may be arranged over the upper surface of the device 400, wherein the upper external electrodes 30 may provide an electrical coupling between the device 400 and the mounted components. For example, a mounted component may be a semiconductor package that may include at least one of a semiconductor chip, active electronic components, passive electronic components, etc.

The plurality of dielectric layers 28 may be arranged between the plurality of metallization layers 12 in order to provide an electrical insulation between the metallization layers 12. In addition, the semiconductor chip 10 may be at least partly embedded or encapsulated in the dielectric layers 28. In particular, the dielectric layers 28 may be in (direct) contact with the upper main surface and the lower main surface of the semiconductor chip 10. In this regard, the semiconductor chip 10 may not be required to be arranged on a carrier such as e.g. a leadframe.

Figure 5:
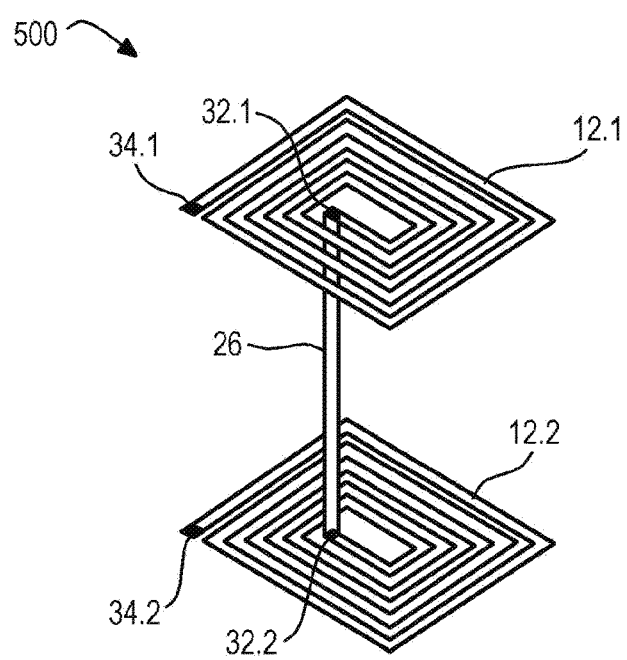
FIG. 5 schematically illustrates a perspective view of a passive component including windings. The passive component may be included in a device in accordance with the disclosure.
Figure 6:
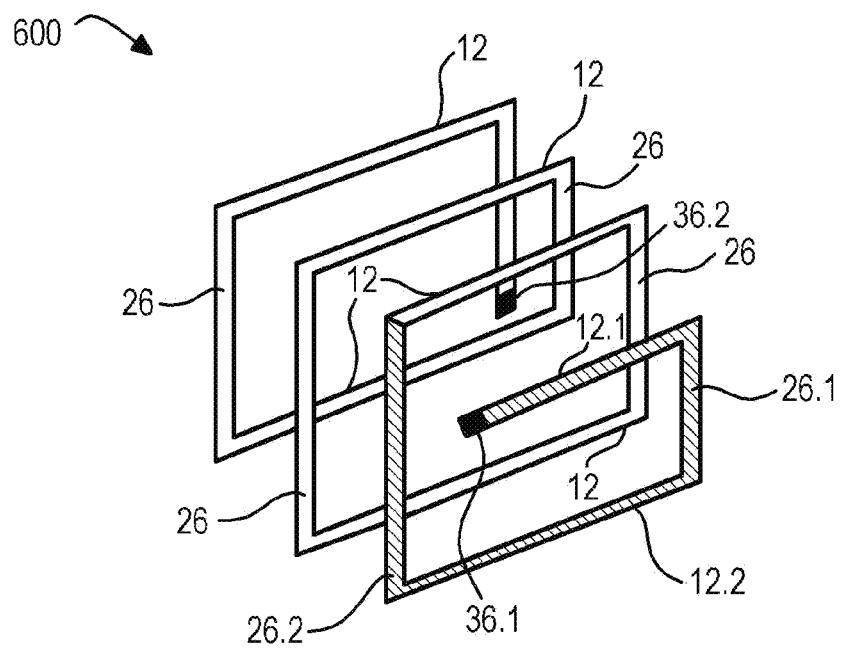
FIG. 6 schematically illustrates a perspective view of a passive component including windings. The passive component may be included in a device in accordance with the disclosure.

FIGS. 5 and 6 schematically illustrate perspective views of passive components 500 and 600 including windings. Each of the passive components 500 and 600 may be included in a device in accordance with the disclosure. Referring back to FIGS. 1 to 4, the passive components 500 and 600 may be arranged in a region of the metallization layers 12 indicated by the dashed rectangle.

The passive component 500 illustrated in FIG. 5 may be formed by windings arranged in a first metallization layer 12.1 and a second metallization layer 12.2 and a via 26 electrically coupling the layers. For example, the passive component 500 may correspond to an inductor, a coil or a transformer. It is understood that similar passive components may be formed by a different number of metallization layers 12 and vias 26. For example, a passive component may be formed by windings of only one metallization layer 12. In a further example, a passive component may be formed by windings arranged in more than two metallization layers 12 that may be interconnected by multiple vias 26.

In the example of FIG. 5, the parts of the passive component 500 formed in the first and second metallization layers 12.1 and 12.2 may include a number of four windings, respectively. In sum, the passive component 500 may thus include a total number of eight windings. In further examples, the numbers and diameters of the windings in the metallization layers 12 may be arbitrary and may particularly depend on a desired inductance of the passive component. In the example of FIG. 5, the windings of different metallization layers 12 may be interconnected by a via 26 at contact points 32.1 and 32.2 located at the inner end points of the windings. In a further example, the windings formed in different metallization layers may be interconnected at the outer end points 34.1 and 34.2 of the windings. In yet a further example that employs more than two metallization layers 12 to form the windings of the passive component, the contact points of the vias 14 may be chosen to alternate between the inner and outer end points of the windings from one layer to the next.

Referring back to FIG. 4, the windings of the first metallization layer 12.1 may be electrically coupled to an external electrode 30 arranged on the upper surface of the device 400. Further, the windings of the second metallization layer 12.2 may be electrically coupled to one of the electrodes 22 of the semiconductor chip 10. That is, the passive component 500 may be interconnected between an electrode 22 of the semiconductor chip 10 and an external electrode 30. Each of the windings may be arranged substantially parallel to the main surface 14 of the semiconductor chip 10. In the example of FIG. 5, each of the windings of the passive component 500 may be (exclusively) formed in one of the planar metallization layers 12, i.e. the windings do not extend out of a plane defined by the respective planar metallization layer 12. In the example of FIG. 5, the windings may have a substantially rectangular shape. In further examples, the windings may have a different shape, for example substantially circular, elliptical, etc.

The windings of the passive component 600 illustrated in FIG. 6 may be formed by a plurality of vias 26 and a plurality of parts of the metallization layers 12. Similar to FIG. 5, the passive component 600 may correspond to an inductor, a coil or a transformer. In the example of FIG. 6, the passive component 600 may have three and a half windings. In further examples, the number and diameters of the windings may be arbitrary and may particularly depend on a desired inductance of the passive component 600. One winding of the passive component 600 may be formed by a part of a first metallization layer 12.1, a part of a second metallization layer 12.2 and two vias 26.1 and 26.2 interconnecting these parts. In the example of FIG. 6, the windings of the passive component 600 may be arranged substantially parallel to each other. In further examples, the relative arrangement of the windings may differ from the shown example. For example, the windings may be arranged to form a toroidal shape.

Referring back to FIG. 4, the windings of the passive component 600 may be electrically coupled to one of the external electrodes 30 at a contact point 36.1 and to one of the electrodes 22 of the semiconductor chip 10 at a contact point 36.2. Each of the windings may be arranged substantially perpendicular to the main surface 14 of the semiconductor chip 10. In the example of FIG. 6, the windings may have a substantially rectangular shape. In further examples, the windings may have a different shape, for example substantially circular, elliptical, etc.

Figure 7:
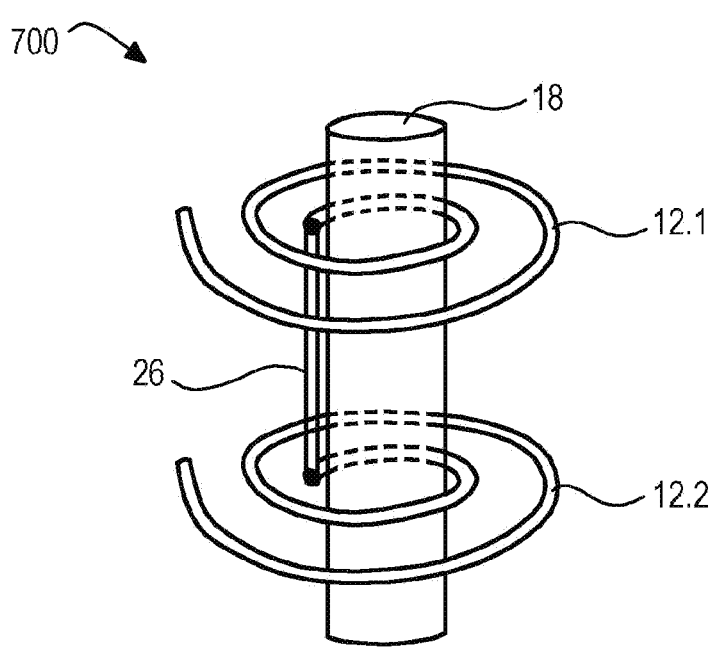
FIG. 7 schematically illustrates a perspective view of a passive component including windings and a magnetic material in form of a magnetic core. The passive component may be included in a device in accordance with the disclosure.
Figure 8:
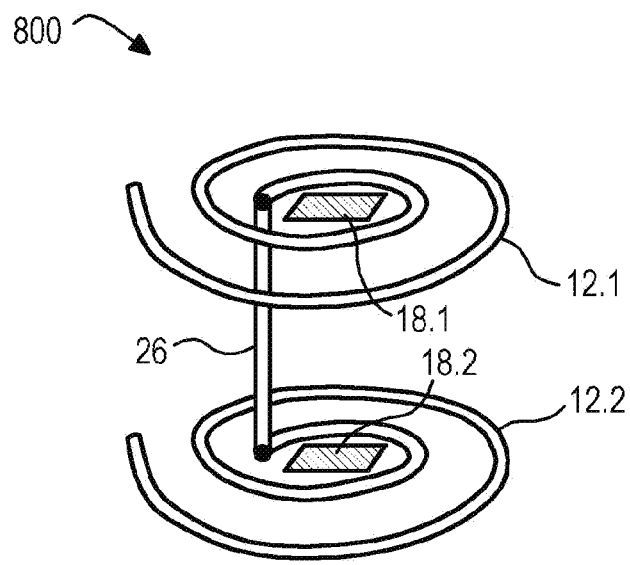
FIG. 8 schematically illustrates a perspective view of a passive component including windings and a magnetic material in form of magnetic sheets. The passive component may be included in a device in accordance with the disclosure.
Figure 9:
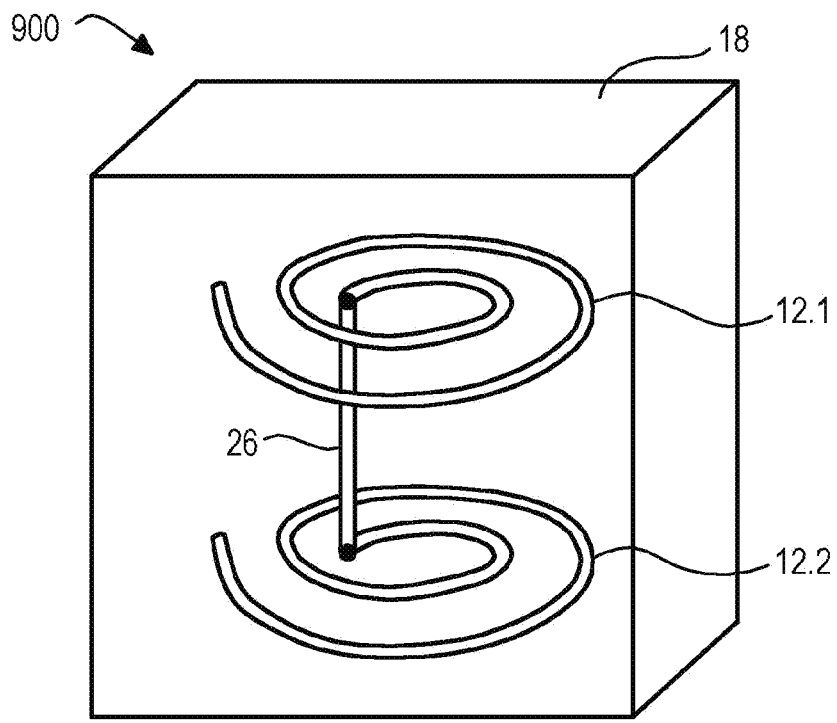
FIG. 9 schematically illustrates a perspective view of a passive component including windings embedded in a magnetic material. The passive component may be included in a device in accordance with the disclosure.

FIGS. 7 to 9 schematically illustrate perspective views of passive components 700 to 900 including windings and a magnetic material. Each of the passive components 700 to 900 may be included in a device in accordance with the disclosure. Referring back to FIGS. 1 to 4, the passive components 700 to 900 may be arranged in a region of the metallization layers 12 indicated by the dashed rectangle. Referring back to FIGS. 2 and 4, the magnetic material may be located in the region 18.

The passive component 700 illustrated in FIG. 7 may be formed by windings arranged in a first metallization layer 12.1 and a second metallization layer 12.2 and a via 14 electrically coupling the layers 12.1 and 12.2. In this regard, the passive component 700 may be similar to the passive component 500 of FIG. 5. In the example of FIG. 7, the parts of the passive component 700 formed in the first and second metallization layers 12.1 and 12.2 may e.g. include a number of two windings, respectively, wherein the windings may e.g. have a substantially circular shape. The windings may be arranged parallel or perpendicular to a main surface of a semiconductor chip (not illustrated) over which the metallization layers 12.1 and 12.2 may be arranged.

The passive component 700 may include a magnetic material 18 in form of a magnetic core. The magnetic material 18 may be surrounded by the windings in order to increase an inductance of the passive component 700. Referring back to e.g. FIG. 4, the magnetic material 18 may include a ferromagnetic or ferrimagnetic material that may be arranged in an opening extending through the plurality of planar metallization layers 12 and the plurality of dielectric layers 28 in a direction perpendicular to the main surface 14 of the semiconductor chip 10. For example, the required opening may be fabricated by an etching technique, laser ablation, etc.

The passive component 800 illustrated in FIG. 8 may be at least partly similar to the passive component 700. The magnetic material 18 of the passive component 800 may include a plurality of magnetic sheets 18.1 and 18.2 including a ferromagnetic or ferrimagnetic material. Each of the magnetic sheets 18.1 and 18.2 may be arranged in a plane defined by one of the plurality of planar metallization layers 12.1 and 12.2 and may be surrounded by the windings. In the example of FIG. 8, the magnetic sheets 18.1 and 18.2 may have a substantially rectangular shape. In further example, the shape of the magnetic sheets 18.1 and 18.2 may be different, for example substantially circular, elliptical, etc. For example, the magnetic sheets 18.1 and 18.2 may be manufactured based on a photolithography technique.

The magnetic material 18 of the passive component 900 illustrated in FIG. 9 may include a soft ferromagnetic material in which the windings of the passive component 900 may be embedded or encapsulated. In one example, the windings may particularly be embedded in at least one of an amorphous cobalt alloy and a cobalt fluoropolymer. Referring back to FIG. 4, the magnetic material 18 may at least partly replace the dielectric material 28. For example, the windings may be embedded in the magnetic material 18 based on a molding technique.

Figure 10:
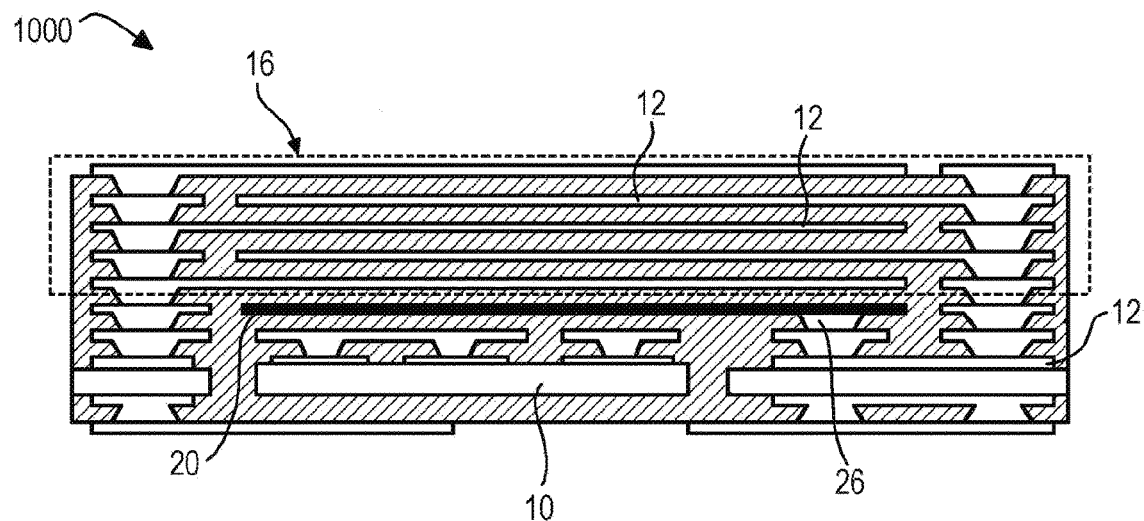
FIG. 10 schematically illustrates a cross-sectional side view of a device in accordance with the disclosure including a metal structure configured to provide an electromagnetic shielding.

FIG. 10 schematically illustrates a cross-sectional side view of a device 1000 in accordance with the disclosure including a metal structure configured to provide an electromagnetic shielding.

The device 1000 may at least partly be similar to the device 400 of FIG. 4 and may include similar components. In addition, the device 1000 may include a metal structure 20 which may be arranged between the semiconductor chip 10 and the passive component 16. The metal structure 20 may be configured to reduce electromagnetic couplings between the semiconductor chip 10 and the passive component 16. More detailed exemplary shapes of the metal structure 20 are provided below. The metal structure 20 may be at least partly formed by the plurality of planar metallization layers 12. In general, a shape of the metal structure 20 may be configured to reduce an induction of electric currents in the metal structure 20 during an operation of the device 1000. In the example of FIG. 10, the metal structure 20 may be electrically coupled to metallization layers 12 and vias 16 that provide a ground potential such that the metal structure 20 may be grounded in order to increase an electromagnetic decoupling between the semiconductor chip 10 and the passive component 16.

Figure 11:
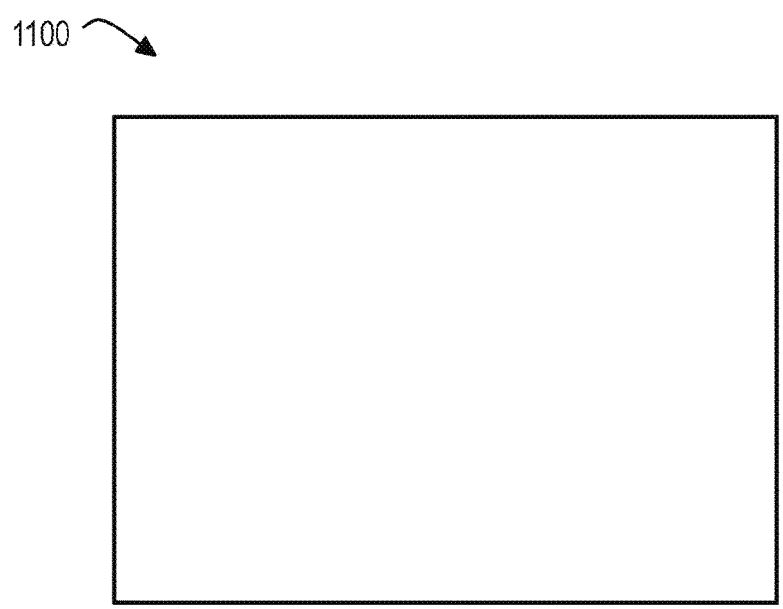
FIG. 11 schematically illustrates a top view of a metal structure that may be included in a device in accordance with the disclosure.

FIG. 11 schematically illustrates a top view of a metal structure 1100 that may be included in a device in accordance with the disclosure. The metal structure 1100 may correspond to a plain metal area (or plain metal sheet). In the example of FIG. 11, the metal structure 1100 may have a substantially rectangular shape. In further examples, the metal structure 1100 may have a different shape, for example substantially circular, elliptic, etc.

Figure 12:
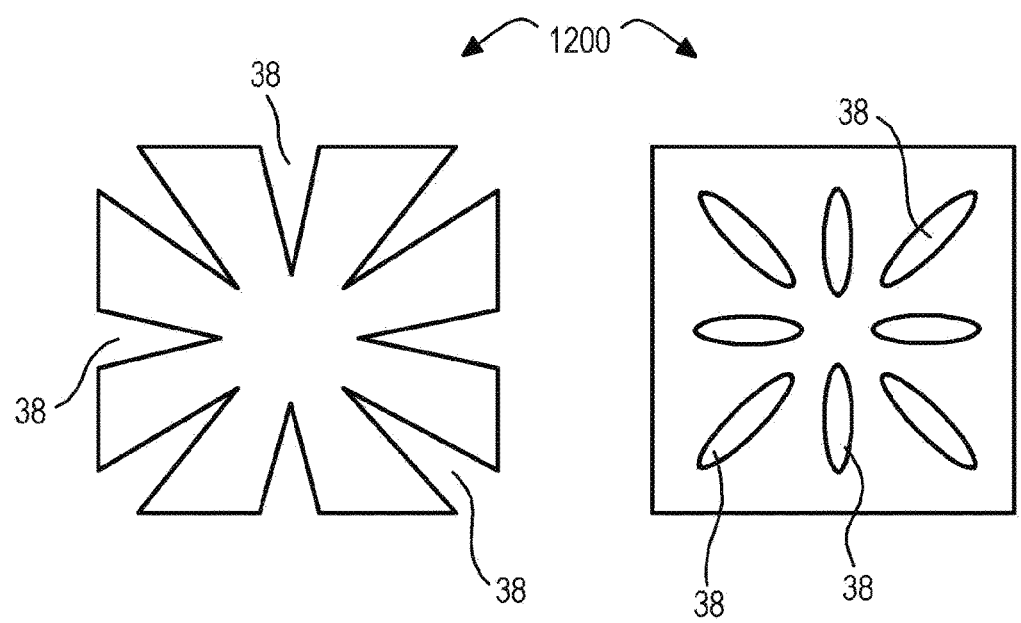
FIG. 12 schematically illustrates a top view of metal structures that may be included in a device in accordance with the disclosure.

FIG. 12 schematically illustrates a top view of two exemplary metal structures 1200 each of which may be included in a device in accordance with the disclosure. Similar to FIG. 11, the metal structures 1200 may correspond to a plain metal area (or plain metal sheet). An electric current through windings of a passive component arranged near one of the metal structures 1200 may induce undesired (in particular circular) electric currents in the metal structure 1200. Therefore, the metal structure 1200 may have a shape that may be configured to reduce an induction of such (in particular circular) electric currents. In the example of FIG. 12, the metal structures 1200 may include a plurality of openings 38 that may extend from a periphery to a center of the metal structures 1200 in a substantially radial direction. At least at the positions of the openings 38, an induction of circular currents may be reduced or interrupted. The openings 38 may have an arbitrary shape, for example triangular, rectangular, circular, elliptical, etc.

Figure 13:
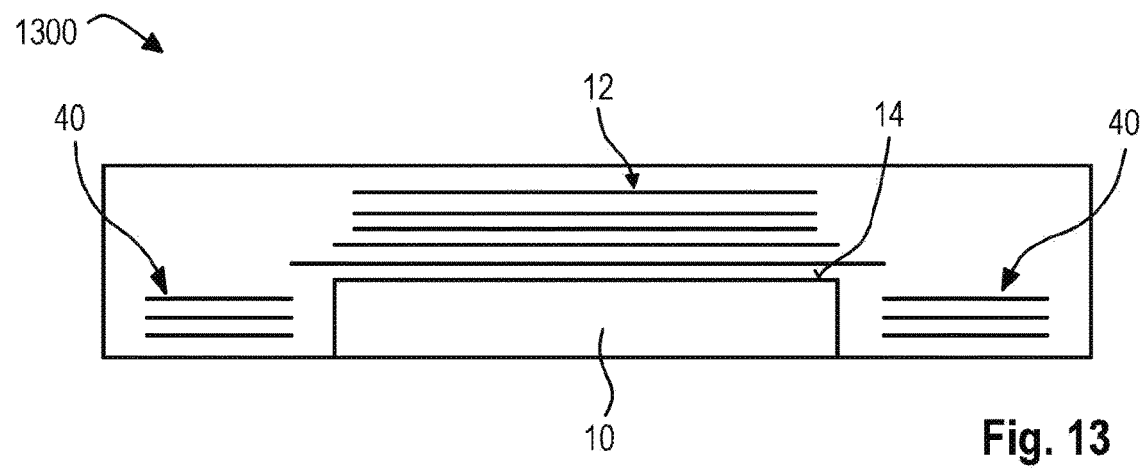
FIG. 13 schematically illustrates a cross-sectional side view of a device in accordance with the disclosure.

FIG. 13 schematically illustrates a cross-sectional side view of a device 1300 in accordance with the disclosure. In the example of FIG. 13, the device 1300 is illustrated in a general manner in order to qualitatively specify an aspect of the disclosure. The device 1300 may include further components that are not illustrated for the sake of simplicity. For example, the device 1300 may further include one or more components of the other devices in accordance with the disclosure.

The device 1300 may at least partly be similar to the device 100 of FIG. 1 and may include similar components. The device 100 may include a semiconductor chip 10 and a plurality of first planar metallization layers 12 arranged over a main surface 14 of the semiconductor chip 10. In addition, second planar metallization layers 40 may be arranged adjacent to the semiconductor chip 10, wherein the second windings 40 may surround the semiconductor chip 10. The device 1300 may include a passive component that may include first windings formed from the first metallization layers 12 and second windings formed from the second metallization layers 40. Here, the first windings of the passive component may be electrically coupled to the second windings of the passive component. For example, the first windings and the second windings may have a form as shown in FIG. 5. Compared to the device 100 of FIG. 1, the arrangement of FIG. 13 may provide a device 1300 having a reduced height. Since a part of the windings of the passive component may be arranged adjacent to the semiconductor chip, the number of windings arranged over the semiconductor chip 10 may be reduced while providing a similar inductance of the passive component.

Figure 14:
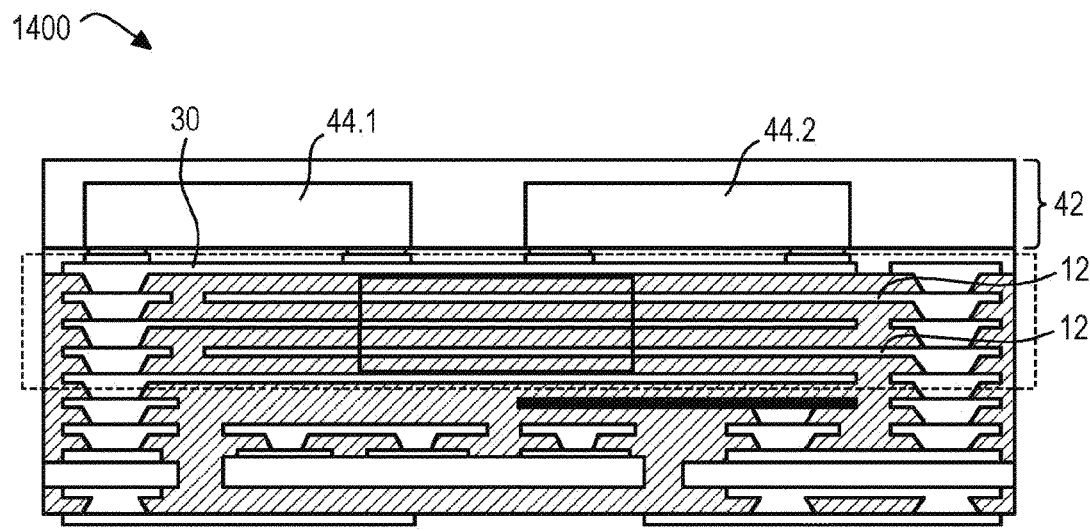
FIG. 14 schematically illustrates a cross-sectional side view of a device in accordance with the disclosure.

FIG. 14 schematically illustrates a cross-sectional side view of a device 1400 in accordance with the disclosure. The device 1400 may be similar to the device 400 of FIG. 4 and may include similar components. In addition, the device 1400 may include a unit 42 that may be arranged over the plurality of metallization layer 12 and may be electrically coupled to the upper external contact electrodes 30. In the example of FIG. 14, the unit 42 may include two passive electronic components 44.1 and 44.2 (e.g. capacitors) that may be embedded in an encapsulation material such as e.g. one of a mold compound, a glob-top material, a laminate material, etc. In further examples, the unit 42 may correspond to a semiconductor package including one or more of semiconductor chips, active electronic components, passive electronic components, etc.

Figure 15:
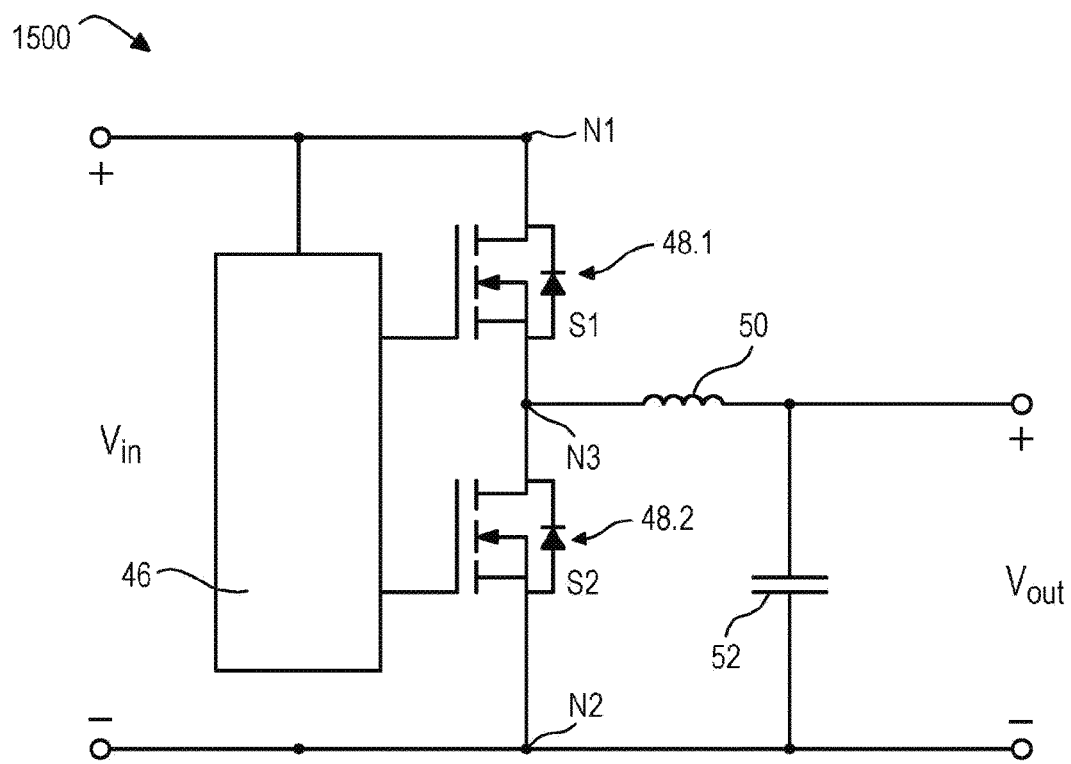
FIG. 15 illustrates a schematic diagram of a circuitry that may be implemented in a device in accordance with the disclosure.

FIG. 15 shows a schematic diagram of a circuitry 1500 which may be implemented in a device in accordance with the disclosure. The circuitry 1500 may be configured to operate as a DC-DC converter. DC-DC converters may be used to convert a DC input voltage $V_{in}$ provided by e.g. a battery into a DC output voltage $V_{out}$ matched to the demand of e.g. electronic circuits connected downstream. DC-DC converters may be embodied as step down converters, in which the output voltage is less than the input voltage, or as step up converters, in which the output voltage is greater than the input voltage. Frequencies of several MHz or higher may be applied to DC-DC converters. Furthermore, currents of up to 100 A or even higher may flow through the DC-DC converters.

The circuitry 1500 may include an input at which an input voltage $V_{in}$ may be applied and an output at which an output voltage $V_{out}$ may be provided. Further, the circuitry 1500 may include a driver (or control) circuit 46, a first power transistor 48.1, a second power transistor 48.2, an inductor 50 and a capacitor 52 which may be arranged as illustrated in FIG. 15.

The first power transistor 48.1 and the second power transistor 48.2 may be connected in series and may be configured to operate as switches S1 and S2 of a half bridge circuit arranged between nodes N1 and N2. The driver circuit 46 may be configured to drive at least one of the first power transistor 48.1 and the second power transistor 48.2. In particular, the driver circuit 46 may be configured to drive the gate electrodes of the power transistors 48.1 and 48.2 and may thus be referred to as a gate driver.

Constant electrical potentials may be applied to the nodes N1 and N2. For example, a high potential, such as 10, 12, 18, 50, 110, 230, 500 or 1000 V or any other potential, may be applied to the node N1 and a low electrical potential, for example 0 V, may be applied to the node N2. The switches S1 and S2 may be switched at frequencies in the range from 1 kHz to 100 MHz, but the switching frequencies may also be outside this range. This means that a varying electrical potential may be applied to a node N3 arranged between the switches S1 and S2 during an operation of the half bridge. The potential of the node N3 may vary in the range between the low and the high electrical potential.

All components of the circuitry 1500 may be implemented in a same package. For example, the circuitry 1500 may be implemented in a device similar to the device 400 of FIG. 4 including one driver chip and two power transistor chips. That is, referring back to FIG. 4 which only shows one semiconductor chip 10, two additional chips may be arranged in the device 400. For example, these additional two chips may be arranged adjacent to the semiconductor chip 10. The plurality of planar metallization layers 12 may be arranged over at least one of the semiconductor chips and may be electrically coupled to the first power transistor 48.1 and the second power transistor 48.2. The windings of the inductor 50 may be at least partly formed by the plurality of planar metallization layers 12. In one example, the capacitor 52 may be formed in the metallization layers 12 as well. In a further example, the capacitor 52 may be arranged as a separate unit over the metallization layers 12 as illustrated in FIG. 14.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the term "exemplary" is merely meant as an example, rather than the best or optimal. It is also to be appreciated that features and/or elements depicted herein are illustrated with particular dimensions relative to each other for purposes of simplicity and ease of understanding and that actual dimensions may differ substantially from that illustrated herein.

Although specific aspects have been illustrated and described herein, it will be appreciated by those of ordinary skill in the art that a variety of alternate and/or equivalent implementations may be substituted for the specific aspects shown and described without departing from the concept of the disclosure. This application is intended to cover any adaptations or variations of the specific aspects discussed herein. Therefore, it is intended that this disclosure be limited only by the claims and the equivalents thereof.

What is claimed is:

1. A device, comprising:
   a semiconductor chip;
   a plurality of planar metallization layers arranged over a main surface of the semiconductor chip;
   a passive component comprising windings, wherein each of the windings is formed in one of the plurality of planar metallization layers; and
   an electromagnetic shielding structure arranged between the passive component and the semiconductor chip.

2. The device of claim 1, wherein the passive component comprises at least one of an inductor and a transformer.

3. The device of claim 1, wherein the windings are arranged inside an outline of the semiconductor chip when viewed in a direction perpendicular to the main surface.

4. The device of claim 1, wherein each of the windings is arranged parallel to the main surface.

5. The device of claim 1, wherein a height of the passive component in a direction perpendicular to the main surface is smaller than 0.5 millimeter.

6. The device of claim 1, further comprising a plurality of vias electrically coupling windings arranged in different ones of the plurality of planar metallization layers.

7. The device of claim 1, wherein the plurality of planar metallization layers is electrically coupled to an electrode of the semiconductor chip.

8. The device of claim 7, wherein the plurality of planar metallization layers provides an electrical coupling between an electrode of the semiconductor chip and an electrode arranged on a periphery of the device.

9. The device of claim 1, wherein the semiconductor chip is embedded in a dielectric material, wherein the dielectric material is in contact with the main surface and a second main surface of the semiconductor chip opposite the main surface.

10. The device of claim 1, further comprising a second plurality of planar metallization layers arranged over a second main surface of the semiconductor chip opposite the main surface.

11. A device, comprising;
    a semiconductor chip;
    a plurality of planar metallization layers arranged over a main surface of the semiconductor chip;
    a passive component comprising windings, wherein each of the windings is formed in one of the plurality of planar metallization layers; and
    wherein the passive component comprises second windings electrically coupled to the windings and arranged adjacent to the semiconductor chip, wherein the second windings surround the semiconductor chip.

12. A device, comprising:
    a semiconductor chip;
    a plurality of planar metallization layers arranged over a main surface of the semiconductor chip;
    a passive component comprising windings, wherein the windings are at least partly formed by the plurality of planar metallization layers;
    a magnetic material surrounded by the windings; and
    wherein the magnetic material comprises a ferromagnetic or ferrimagnetic core arranged in an opening extending through the plurality of planar metallization layers.

13. The device of claim 12, wherein the windings are embedded in a soft ferromagnetic material.

14. The device of claim 12, wherein the windings are embedded in at least one of an amorphous cobalt alloy and a cobalt fluoropolymer.

15. The device of claim 12, wherein each of the windings is arranged parallel to the main surface.

16. A device, comprising:
    a semiconductor chip;
    a plurality of planar metallization layers arranged over a main surface of the semiconductor chip;
    a passive component comprising windings, wherein the windings are at least partly formed by the plurality of planar metallization layers;
    a magnetic material surrounded by the windings; and
    wherein the magnetic material comprises a plurality of magnetic sheets comprising a ferromagnetic or ferrimagnetic material, wherein each of the magnetic sheets is arranged in one of the plurality of planar metallization layers and surrounded by the windings.

17. A device, comprising:
    a semiconductor chip;
    a plurality of planar metallization layers arranged over a main surface of the semiconductor chip;
    a passive component comprising windings, wherein the windings are at least partly formed by the plurality of planar metallization layers; and
    a metal structure arranged between the semiconductor chip and the passive component, wherein the metal structure is configured to reduce electromagnetic couplings between the semiconductor chip and the passive component.

18. The device of claim 17, wherein the metal structure is at least partly formed by the plurality of planar metallization layers.

19. The device of claim 17, wherein the metal structure is grounded.

20. The device of claim 17, wherein a shape of the metal structure is configured to reduce an induction of electric currents in the metal structure during an operation of the device.

21. The device of claim 17, wherein the metal structure comprises a plurality of openings having a shape configured to reduce an induction of electric currents in the metal structure during an operation of the device.

* * * * *